United States Patent [19]

Cleeves

[11] Patent Number: 5,573,971
[45] Date of Patent: Nov. 12, 1996

[54] PLANAR ANTIFUSE AND METHOD OF FABRICATION

[75] Inventor: James M. Cleeves, Redwood City, Calif.

[73] Assignee: Cypress Semiconductor, Corporation, San Jose, Calif.

[21] Appl. No.: 580,938

[22] Filed: Dec. 29, 1995

[51] Int. Cl.$^6$ ................................................. H01L 21/441
[52] U.S. Cl. ........................... 437/60; 437/192; 437/922
[58] Field of Search .............................. 437/60, 192, 194, 437/197, 922; 148/DIG. 55

[56] References Cited

U.S. PATENT DOCUMENTS

| | | | |
|---|---|---|---|
| 5,353,246 | 10/1994 | Tsang et al. | 437/192 |
| 5,362,676 | 11/1994 | Gordon et al. | 437/922 |
| 5,395,797 | 3/1995 | Chen et al. | 437/922 |
| 5,440,167 | 8/1995 | Iranmanesh | 437/192 |

Primary Examiner—Chandra Chaudhari
Attorney, Agent, or Firm—Blakely, Sokoloff, Taylor & Zafman

[57] ABSTRACT

A method of forming an antifuse. A first conductive layer is deposited over a substrate. Next, a capping layer is deposited onto the conductive layer. An antifuse layer is then deposited onto the capping layer. A barrier layer is then deposited onto the antifuse layer. Next, the first conductive layer, the capping layer, the antifuse layer, and the barrier layer are patterned into a metal stack. A disposable post is then formed on the barrier layer of the patterned metal stack. The barrier layer and the antifuse layer are then etched substantially in alignment with the disposable post to leave a first metal interconnect. Next, an insulating layer is formed over the substrate including the first metal interconnect and the disposable post wherein the insulating layer is made substantially planar with the disposable post. The disposable post is then removed to form an aperture in the insulating layer. A second conductive layer is then deposited into the aperture and onto the barrier layer.

8 Claims, 3 Drawing Sheets

PLANAR ANTIFUSE AND METHOD OF FABRICATION

BACKGROUND OF THE INVENTION

1. FIELD OF THE INVENTION

The present invention relates to the field of semiconductor fabrication and more specifically to a planar antifuse and its method of fabrication in a semiconductor integrated circuit.

2. Discussion of Related Art

Integrated circuits are made up of literally millions of discrete devices such as transistors, capacitors and resistors which are interconnected together to form functional integrated circuits. In many cases, it is desirable to have an option after the fabrication of integrated circuits as to whether or not certain devices or components are to be electrically coupled together. For example, after the completion of a memory product, rows of memory cells are checked to determine which rows contain defective cells. The addresses of defective rows are then coupled to redundant rows provided in the memory circuit. In order to couple the address of defective rows to redundant rows, antifuses are provided. Antifuses are devices which can be irreversibly altered from an initial non-conductive to a conductive state by applying a voltage across it. In this way, addresses of defective rows can be coupled to redunda necessary. Antifuses are also used in logic devices such as programmable application specific integrated circuits (ASICs). Antifuses allow substantially completed integrated circuits to be programmed to a desired functionality.

A problem with present antifuse devices is that they are generally formed between nonplanar interfaces. This results in geometry and topography induced high electric fields which detrimentally affect the performance of the antifuse device. Additionally, the nonplanar of structures typically result in the formation of "stringers" which can cause short circuits and device failures. Additionally, present methods of fabricating antifuses typically utilize complex processes which require many steps such as planarizations and cleaning which increase the cost of the fabricated transistor and which decrease the reliability and manufacturability of the process. Such complex and dirty processes affect the surface properties of the fusing structure which can detrimentally affect the quality and performance of the fabricated antifuse.

Thus, what is necessary is a simple method of fabricating a planar antifuse.

SUMMARY OF THE INVENTION

A method of forming a planar antifuse device between two metal layers is described. According to the present invention, a first aluminum layer is formed over a substrate. Next, a titanium-tungsten capping layer is formed over the aluminum layer. An amorphous silicon antifuse layer is then deposited onto the titanium-tungsten capping layer. A titanium-tungsten barrier layer is then deposited onto the amorphous silicon layer. Next, the aluminum layer, the titanium-tungsten capping layer, the amorphous silicon antifuse layer, and the titanium-tungsten barrier layer are patterned into a first metal stack. Next, a photoresist post is formed on the titanium-tungsten barrier layer. Next, the titanium-tungsten barrier layer and the amorphous silicon antifuse layer are etched substantially in alignment with the photoresist post. An insulating layer is then deposited over the substrate including the patterned interconnect stack and the photoresist post. The insulating layer is then planarized to uncover the photoresist post. The photoresist post is then removed to form an aperture in the insulating layer. A second metal layer is then formed into the aperture and onto the titanium-tungsten barrier layer.

BRIEF DESCRIPTION OF THE DRAWINGS

FIG. 1b is an illustration of a cross-sectional view showing the patterning of the aluminum layer, the titanium-tungsten capping layer, the amorphous silicon antifuse layer, and the titanium-tungsten barrier layer into a first patterned metal stack on the substrate of FIG. 1a.

DETAILED DESCRIPTION OF THE PRESENT INVENTION

The present invention discloses novel planar antifuse and its method of fabrication in a semiconductor integrated circuit. In the following description, numerous specific details such as specific process steps, materials, etc. are set forth in order to provide a thorough understanding of the present invention. It will be obvious, however, to one skilled in the art, that the present invention may be practiced without these specific details. In other instances, well known semiconductor integrated circuit manufacturing steps and equipment have not been set forth in detail in order to not unnecessarily obscure the present invention.

According to the present invention, a substrate 100 is provided. Substrate 100 includes a semiconductor substrate such as, but not limited to, silicon in which have been formed a plurality of active and passive devices such as transistors, capacitors and resistors. Substrate 100 also includes an outermost interlayer dielectric which is used to electrically isolate a subsequently formed first metallization layer used to interconnect the various devices formed in an integrated circuit. Accordingly, a substrate is generally referred to in the present invention as the material on which layers are formed and on which processes act.

According to the present invention, a bulk conductor 202 is blanket deposited over substrate 100 with any well known technique. Bulk conductor 202 will make up the main current carrying material of a subsequently formed interconnection (metal-1). Bulk conductor 202 is preferably aluminum doped with a small (0.5%) of copper formed by sputtering, but may also may be other low resistance material such as, but not lim copper, silver, and tungsten, and combinations thereof. Bulk conductor 202 is formed thick enough to provide a suitable low resistance interconnect for the fabricated integrated circuit. Additionally, although not shown, a barrier layer such as titanium or titanium-nitride may be formed over substrate 100 prior to bulk conductor 202's deposition in order to help prevent diffusion of bulk conductor 202 into substrate 100 and to provide adhesion to substrate 100.

Figure 1A:
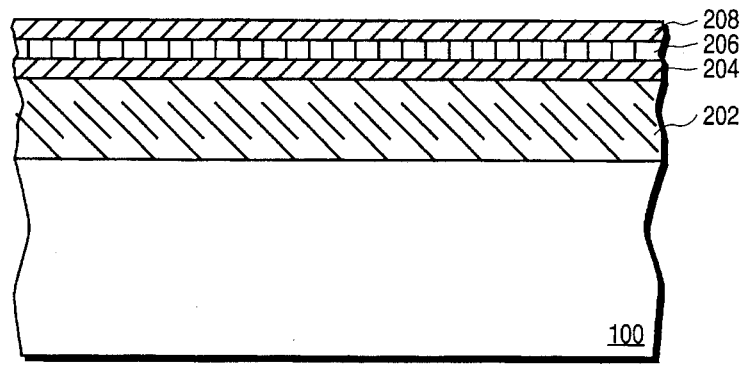
FIG. 1a is an illustration of a cross-sectional view showing the formation of an aluminum bulk conductor layer, a titanium-tungsten capping layer, an amorphous silicon antifuse layer, and a titanium-tungsten barrier layer over a substrate.

Next, according to the preferred method of the present invention, a capping layer 204 is blanket deposited with well known techniques over bulk conductor 202. Capping layer 204 is preferably a titanium-tungsten layer formed to a thickness of approximately 2000Å by sputtering from a 10% titanium 90%-tungsten (by weight) target. Capping layer 204 is provided to help prevent out diffusion of atoms from bulk conductor 202 and also to help prevent electromigration of bulk conductor 202. Next, as shown in FIG. 1a, an antifuse layer 206 is blanket deposited over capping layer 204. Layer 206 is said to be an "antifuse" layer because in its deposited state, it does not substantially conduct electricity, but may be irreversibly altered into a conductive state by placing voltages across it. According to the present invention, antifuse layer 206 is preferably amorphous silicon deposited by sputtering to a thickness between 500–2000Å. Antifuse layer 206 is formed to a thickness sufficient to provide a suitable antifuse.

Next, as shown in FIG. 1a, a barrier layer 208 is blanket deposited over antifuse layer 206. Barrier layer 208 prevents diffusion of atoms out of a subsequently deposited bulk conductor 216. Such a diffusion could cause a short across antifuse layer 206 rendering the antifuse conductive and therefore obsolete. Barrier layer 208 is preferably formed of the same material and to the same thickness as capping layer 204 which in the preferred embodiment of the present invention is a sputter deposited titanium-tungsten layer having a thickness of approximately 2000Å. According to the preferred embodiment of the present invention, bulk conductor 202, capping layer 204, antifuse layer 206, and barrier layer 208 are deposited in a single pass through system to insure clean interfaces between respective layers.

Figure 1B:
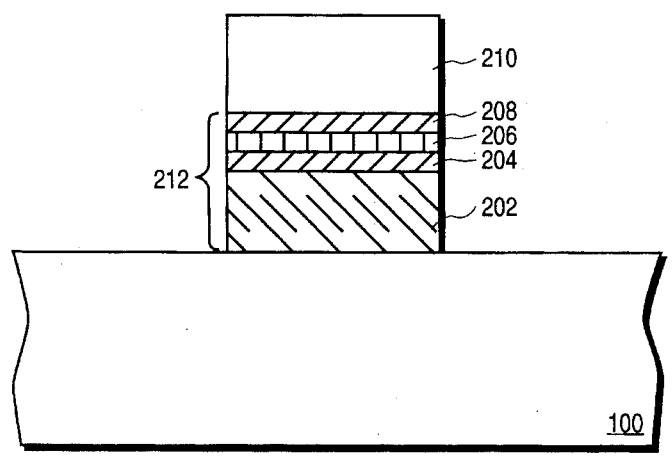

Next, as shown in FIG. 1b, a photoresist layer is blanket deposited over barrier layer 208 and patterned with well known photolithography techniques to generate a photoresist mask 210 which defines locations where a first level of interconnects are to be formed (i.e. metal-1). Next, barrier layer 208, antifuse layer 206, capping layer 204 and bulk conductor 202 are antisotropically etched in alignment with photoresist mask 210 to form a first metal stack 212, having a pattern or layout desired for the first level of interconnect (i.e. metal-1). Any suitable and well known etching technique such as reactive ion etching can be used to form metal stack 212. If bulk conductor layer 202 is an aluminum layer, and capping layer 204 is a titanium-tungsten layer, and antifuse layer 206 is an amorphous silicon layer, and barrier layer 208 is a titanium-tungsten layer, then barrier layer 208 can be reactive ion etched utilizing a fluorine chemistry such as $C_2F_6$, and antifuse material 206 can be reactive ion etched utilizing a chlorine chemistry such as $Cl_2$, and capping layer 204 can be reactive ion etched utilizing a fluorine chemistry such as $C_2F_6$ and bulk conductive layer 202 can be reactive ion etched utilizing a chlorine chemistry such as $BCl_3$ or $Cl_2$.

Figure 1C:
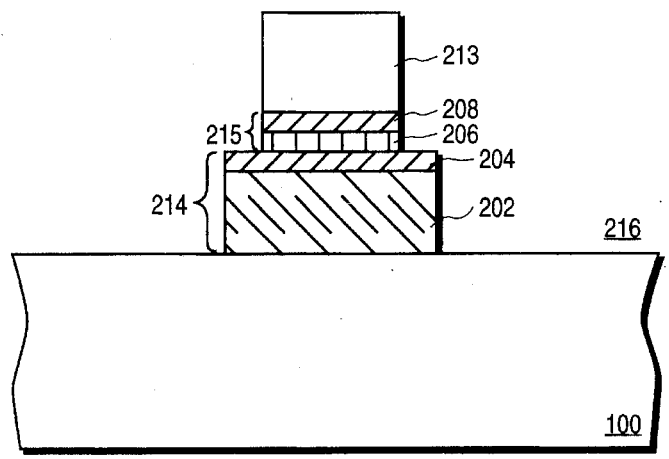
FIG. 1c is an illustration of a cross-sectional view showing the formation of a resist post and the patterning of the barrier layer and the antifuse layer on the substrate of FIG. 1b.

Next, as shown in FIG. 1c, photoresist mask 210 is stripped with well known techniques. A photoresist layer is then blanket deposited over substrate 100 including metal stack 212. The second photoresist layer is then masked, exposed and developed with well known photolithography techniques to form a photoresist post 213. Photoresist post 213 defines a location 215 on capping layer 204 where an antifuse is to be formed. Photoresist post 213 is preferably formed over a planar portion of metal stack 212.

Next, barrier layer 208 and antifuse layer 206 are antisotropically etched in alignment with photoresist post 213. The portions of barrier layer 208 and antifuse layer 206 not covered by photoresist post 213 are etched off from capping layer 204 to thereby leave a first level of interconnection 214 (metal-1) comprising bulk conductor 202 and capping layer 204. The portions of barrier layer 208 and antifuse layer 206 covered by photoresist post 213 form antifuse location 215 on first interconnect 214.

Figure 1D:
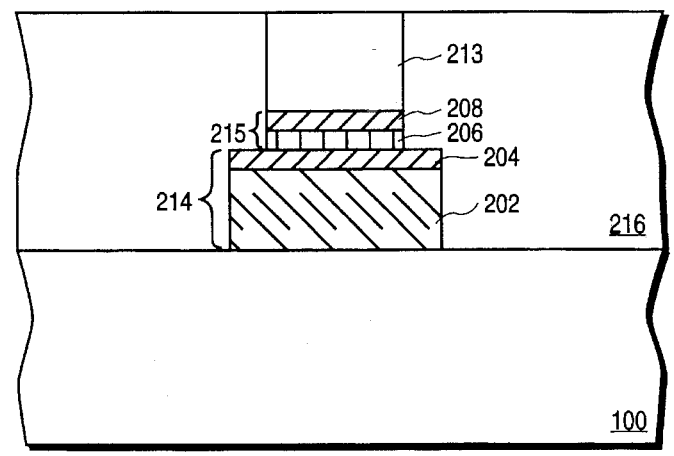
FIG. 1d is an illustration of a cross-sectional view showing the formation of an interlayer dielectric over the substrate of FIG. 1c.
Figure 1E:
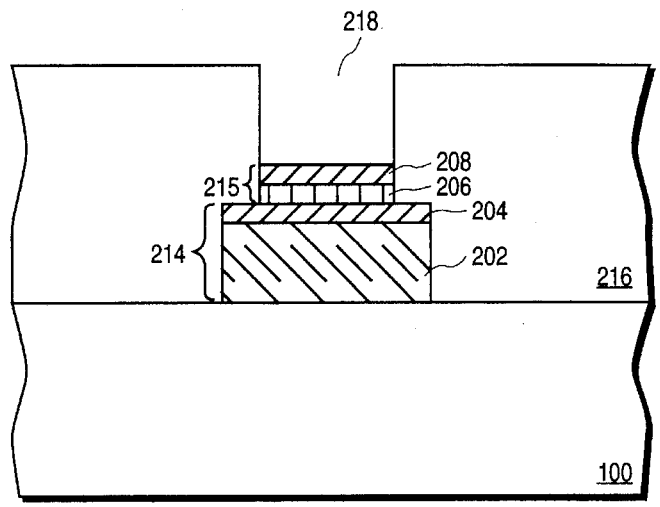
FIG. 1e is an illustration of a cross-sectional view showing the removal of the photoresist post from the substrate of FIG. 1 d.

Next, as shown in FIG. 1d, an interlayer dielectric 216 such as, but not limited to, an doped oxide, doped oxide, spin on glass, nitride, or any combination thereof, is blanket deposited over substrate 100 including first interconnection 214 and photoresist post 213. Interlayer dielectric layer 216 can be formed by any one of the plurality of well known techniques. Interlayer dielectric 216 is then planarized to expose photoresist post 213 as shown in FIG. 1d. According to the preferred embodiment of the present invention, interlayer dielectric 216 is planarized by well known chemical-mechanical polishing techniques to expose photoresist post 213. It is to be noted that one can overpolish ILD 216 and remove a portion of the top surface of photoresist post 213 if desirable Next, as shown in FIG. 1e, photoresist post 213 is removed from substrate 100 to form an aperture or opening 218 in interlayer dielectric 216 over antifuse location 215. Photoresist post 213 can be removed by ashing or other well known techniques. Because photoresist post 213 is removed from ILD 216 to form aperture 218, it is said to be a "disposable" post. It is to be appreciated that aperture 218 preferably has the depth approximately equal to the desired depth of via holes formed in interlayer dielectric 216 which allow electrical connection between a subsequent interconnection level (metal-2) and the first interconnection level 214 (metal-1). As such, the second photoresist layer should be formed thick enough to provide a sufficiently thick photoresist post 213 to form a suitably deep aperture 218.

Additionally, although the preferred method of the present invention utilizes a photoresist post 213 for ease of manufacturing, other disposable posts such as, but not limited to, a polysilicon post can be used if desired. In such a case, a polysilicon layer would be formed over barrier layer 208 and patterned into a polysilicon post utilizing standard photolithography and etching techniques. After the patterning of barrier layer 208 and antifuse layer 206 into an antifuse location 215 and the formation and planarization of an ILD, the polysilicon post would be stripped away and processing continue in the manner described below.

Figure 1F:
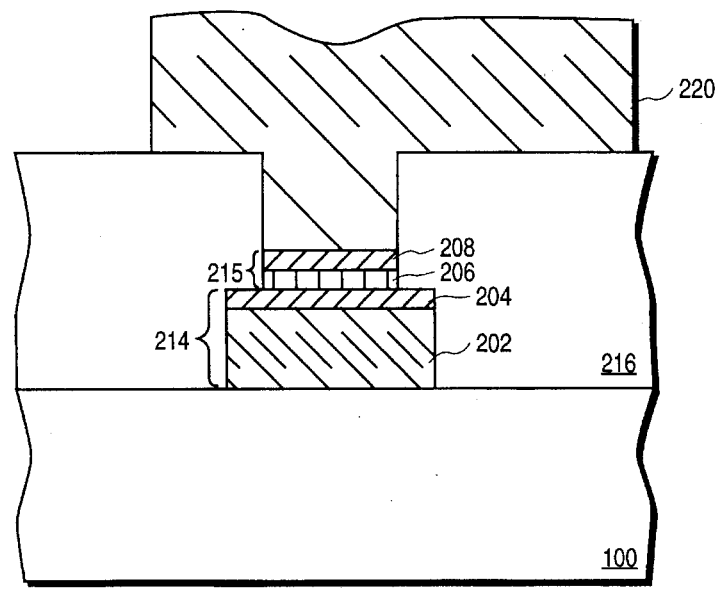
FIG. 1f is an illustration of a cross-sectional view showing the deposition of second metal layer onto the substrate of FIG. 1e.

Next, as shown in FIG. 1f, a second interconnect layer is blanket deposited over substrate 100. The second interconnect layer is formed into aperture 218 and onto barrier layer 208. Barrier layer 208 prevents atoms from out diffusing from the second interconnect layer into antifuse layer 206 and thereby shorting the antifuse. The second interconnect layer is then patterned by well known techniques to define a second level of interconnects 220. It is to be appreciated that other well known methods can be used to fill aperture 218 and form a second level of interconnects. For example, a conductive layer could be blanket deposited over ILD 216 and etched or polished back to form a conductive plug. A second level of interconnection could then be formed over the plug to make electrical contact to the antifuse below.

It is to be noted that the preferred antifuse of the present invention is rendered conductive by applying sufficient voltage to drive current across titanium-tungsten barrier layer 208, amorphous silicon antifuse layer 206, and titanium-tungsten capping layer 204, and cause local heating of these layers and the conversion of the amorphous silicon antifuse layer 206 into a conductive silicide. As such, capping layer 204 and barrier layer 208 need to be formed of a material such as, but not limited to, titanium and tungsten, which can react with antifuse layer 206 to form a suitably low resistance silicide. Additionally, it is to be appreciated that barrier layer 208, capping layer 204, and antifuse layer 206 should be formed to a thickness sufficient to allow complete conversion of antifuse layer 206 into a silicide.

A novel antifuse has been formed between first metal interconnect 214 and second metal interconnect 220. The antifuse of the present invention is characterized by the planar fusing interfaces of capping layer 204 and barrier layer 208. As such, the antifuse of the present invention does not suffer from geometry or topography induced high e-fields. Additionally, the fabrication method of the present invention provides clean and controllable fused surfaces (i.e. capping layer 204 and barrier layer 208) which provide excellent antifuse performance.

Although the present invention has been described with respect to specific details such as dimensions, materials and interconnect levels, it is to be appreciated that such specific details are not to be taken as limiting. For example, although the present invention was described with respect to forming an antifuse between a first level of interconnection and a second level of interconnection one skilled in the art will appreciate the ability to form the antifuse of the present invention, between other interconnection levels such as interconnection level 2 and interconnection level 3. As such, the scope of the present invention is not to be taken as limiting, but rather as illustrative, wherein the scope of the present invention is to be determined by the claims which follow.

Thus, a planar antifuse and its method of fabrication has been described.

I claim:

1. A method of forming an antifuse comprising the steps of:

depositing a first conductive layer over said substrate;

depositing a capping layer onto said conductive layer;

depositing an antifuse layer onto said capping layer;

depositing a barrier layer onto said antifuse layer;

patterning said first conductive layer, said capping layer, said antifuse layer, and said barrier layer into a patterned metal stack;

forming a disposable post on said barrier layer on said patterned metal stack;

etching said barrier layer and said antifuse layer substantially in alignment with said disposable post to form a first metal interconnect;

forming an insulating layer over said substrate including said first metal interconnect and said disposable post wherein said insulating layer is substantially planar with said disposable post;

removing said disposable post to form an aperture in said insulating layer; and depositing a second conductive layer into said aperture and onto said barrier layer.

2. The method of claim 1 wherein said first conductive layer comprises an aluminum alloy.

3. The method of claim 1 wherein said capping layer comprises titanium-tungsten.

4. The method of claim 1 wherein said antifuse layer comprises amorphous silicon.

5. The method of claim 1 wherein said barrier layer comprises titanium-tungsten.

6. The method of claim 1 wherein said disposable post is a photoresist post.

7. The method of claim 1 wherein said disposable post is a polysilicon post.

8. A method of forming an antifuse comprising the steps of:

depositing a first aluminum layer over said substrate;

depositing a first titanium-tungsten layer onto said aluminum layer;

depositing an amorphous silicon layer onto said first titanium tungsten layer;

depositing a second titanium-tungsten layer onto said amorphous silicon layer;

patterning said first aluminum layer, said first titanium-tungsten layer, said amorphous silicon layer, and said second titanium-tungsten layer into a first patterned metal stack;

forming a photoresist layer and patterning said photoresist layer into a photoresist post on said second titanium-tungsten layer;

etching said second titanium-tungsten layer and said amorphous silicon layer substantially in alignment with said photoresist post;

depositing an insulating layer over said substrate including said pattern interconnect stack and said photoresist post;

planarizing said insulating layer to reveal the top surface of said photoresist post;

removing said photoresist post to form an aperture in said insulating layer; and depositing a second metal layer into said aperture and onto said second titanium-tungsten layer.

* * * * *